[19] United States Patent
Grassauer et al.

[11] 4,354,629
[45] Oct. 19, 1982

[54] SOLDER DELIVERY SYSTEM

[75] Inventors: Willie K. Grassauer, Menlo Park; William M. Robinson, Palo Alto, both of Calif.

[73] Assignee: Raychem Corporation, Menlo Park, Calif.

[21] Appl. No.: 158,034

[22] Filed: Jun. 9, 1980

[51] Int. Cl.³ .................................................. B23K 3/00
[52] U.S. Cl. ...................................... 228/56; 228/106; 228/180 A; 228/247
[58] Field of Search ..................... 228/56, 106, 180 R, 228/180 A, 245, 246, 247, 253

[56] References Cited

U.S. PATENT DOCUMENTS

| | | | |
|---|---|---|---|
| 2,390,890 | 12/1945 | MacFarland | 228/246 |
| 3,239,125 | 3/1966 | Sherlock | 228/56 |
| 3,243,211 | 3/1966 | Wetmore | 403/28 |
| 3,297,819 | 3/1966 | Wetmore | 174/127 |
| 3,464,617 | 9/1969 | Raynes et al. | 228/56 |
| 3,538,240 | 11/1970 | Sherlock | 174/88 R |
| 3,589,591 | 6/1971 | Schwenn | 228/44 |
| 3,719,981 | 3/1973 | Steitz | 228/180 R X |
| 3,721,749 | 3/1973 | Clabburn | 174/88 R |
| 3,750,252 | 8/1973 | Landman | 428/571 |
| 3,750,265 | 8/1973 | Cushman | 228/56 |
| 3,914,850 | 10/1975 | Coucoulas | 228/178 |
| 3,996,894 | 8/1968 | Ellis | 228/56 |
| 4,183,611 | 1/1980 | Casciotti et al. | 339/275 B |

FOREIGN PATENT DOCUMENTS

| | | |
|---|---|---|
| 1552962 | 1/1972 | Fed. Rep. of Germany . |
| 659335 | 10/1951 | United Kingdom .................. 228/56 |
| 688172 | 2/1953 | United Kingdom . |
| 1093176 | 11/1967 | United Kingdom . |
| 1099650 | 1/1968 | United Kingdom . |
| 1099906 | 1/1968 | United Kingdom . |
| 1470049 | 4/1977 | United Kingdom . |
| 2023944 | 1/1980 | United Kingdom . |
| 2027561 | 2/1980 | United Kingdom . |

Primary Examiner—Gus T. Hampilos
Attorney, Agent, or Firm—Derek P. Freyberg; Herbert G. Burkard

[57] ABSTRACT

A solder delivery system has a continuous element of solder material disposed between two polymeric layers, one of which is provided with window means to control the flow of solder. The layers may be separate pieces, or may be parts of a folded sheet or a tube of polymeric material. In use, the conductors to be soldered are placed on corresponding terminals of a connector body and the system placed in contact with and perpendicular to the conductors, with the side having the window means towards the conductors. On the application of heat and pressure, the solder melts and flows toward the terminals, and solder bridges are prevented by the "window frames" which lie between the terminals.

14 Claims, 23 Drawing Figures

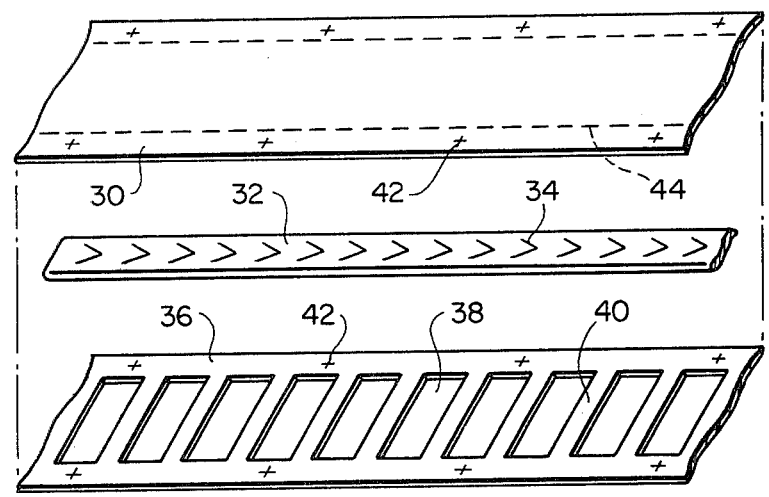
FIG_1
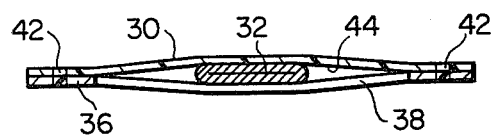
FIG_2
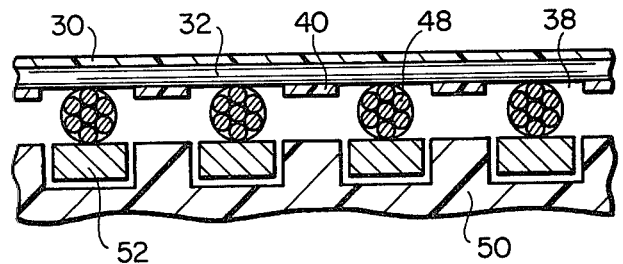
FIG_3
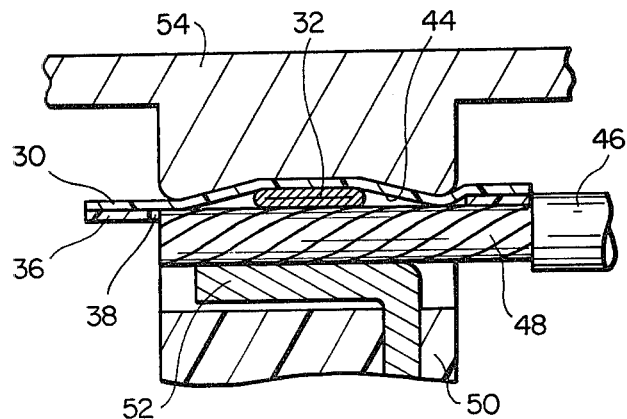
FIG_4

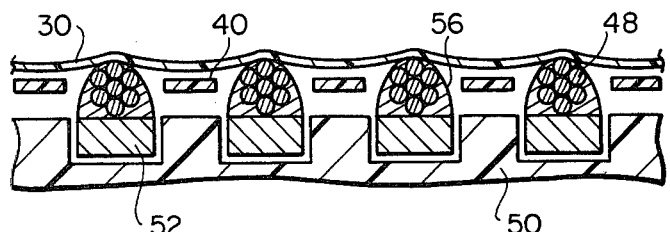
FIG_5
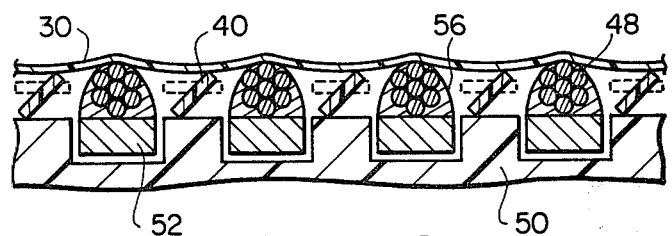
FIG 6
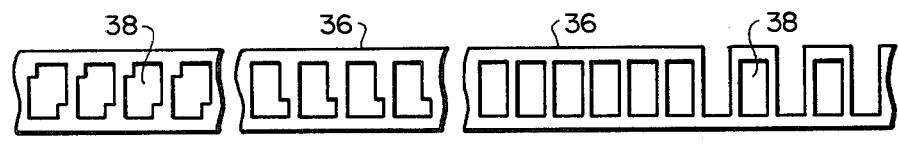
FIG_7
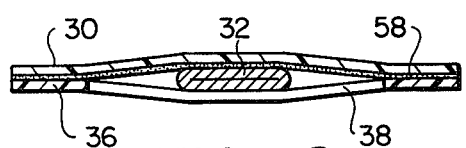
FIG_8
FIG_9
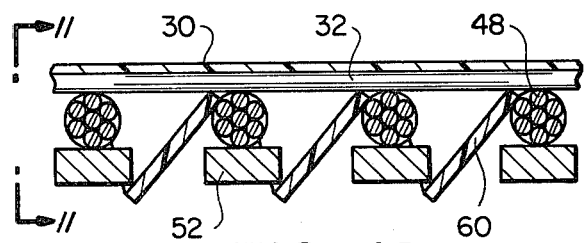
FIG_10

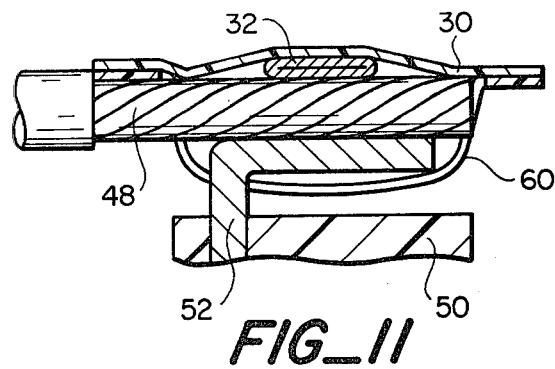
FIG_11
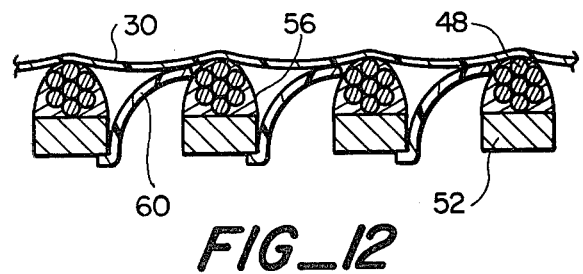
FIG_12
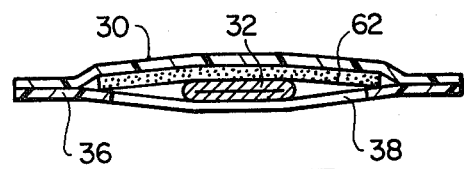
FIG_13
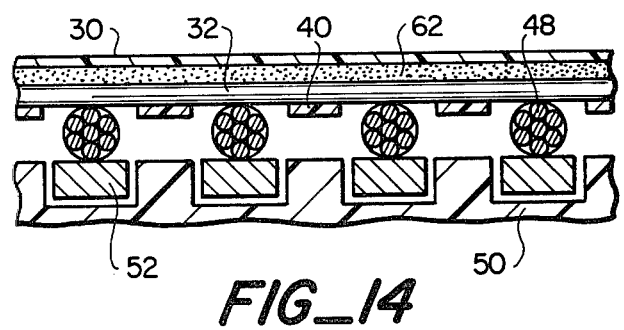
FIG_14
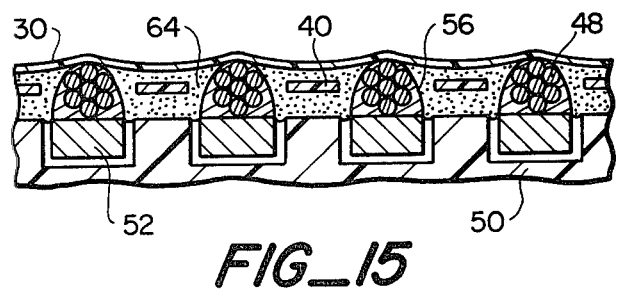
FIG_15

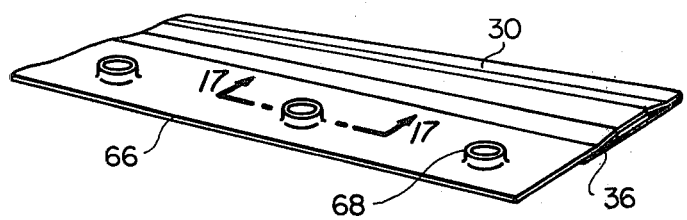
FIG_16
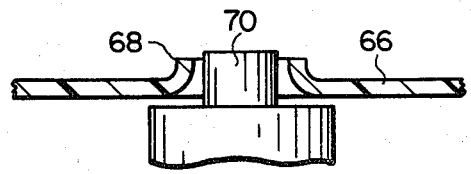
FIG_17
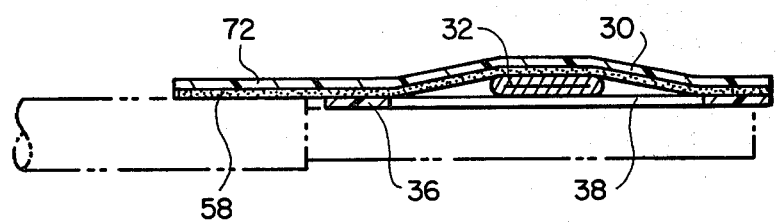
FIG_18
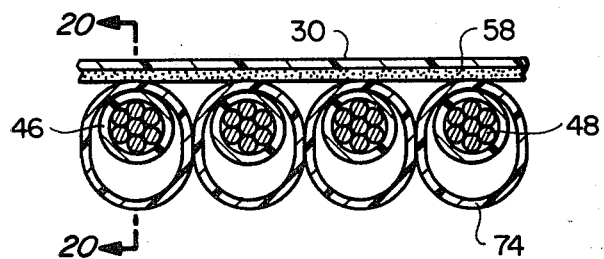
FIG_19
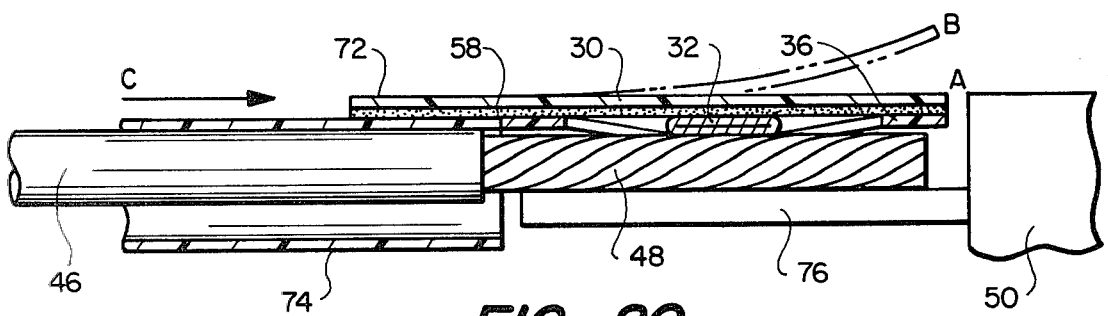
FIG_20

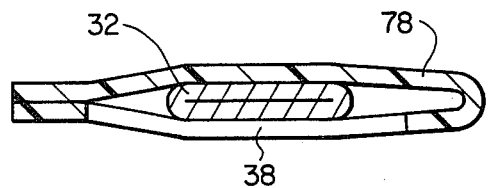
FIG_21
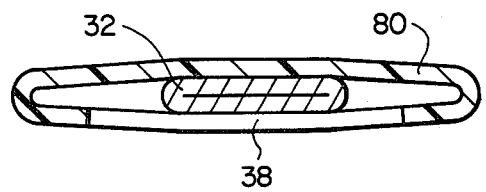
FIG_22
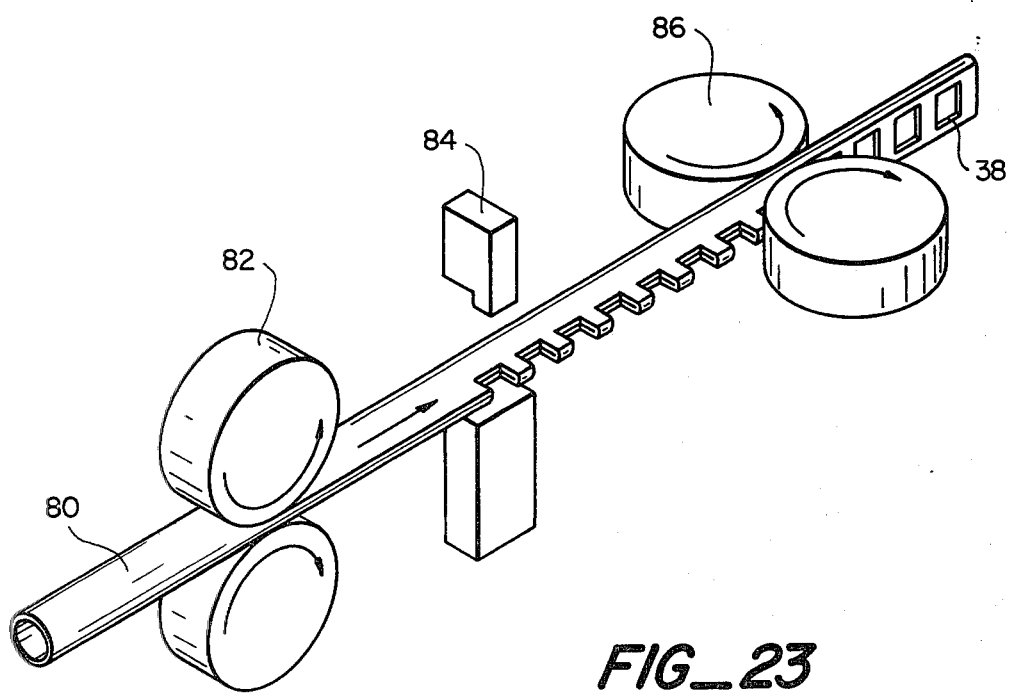
FIG_23

SOLDER DELIVERY SYSTEM

FIELD OF THE INVENTION

This invention relates to a solder delivery system which employs a continuous solder strip. The system is especially adapted to be used to terminate a plurality of closely-spaced conductors to a connector.

BACKGROUND OF THE INVENTION

Joining flat cable or ribbon cable to connectors can be accomplished by a number of different methods, with soldering being probably the most reliable. However, if all the solder terminations must be done by hand, the costs involved and the time required to perform a multiplicity of repetitive soldering operations far outweigh any gains in reliability. In addition, as connector pin spacing decreases, due to higher interconnection densities, the reliability of hand soldering decreases because of the possibility of solder bridging terminations and shorting out adjacent connectors. It would therefore be desirable to have a solder system in which all leads can be soldered to the connector simultaneously, rapidly and reliably for a wide range of a number of terminations and spacings.

In the past, various systems have been developed for simultaneously applying a plurality of bodies of solder. One such system is that disclosed in U.S. Pat. No. 3,396,894, which discloses the prepackaging of metered amounts of flux and solder in a heat-recoverable preformed polymer sheet which forces the solder into place. The patent teaches the use of discrete pieces of solder which must be precisely positioned above regions to be soldered. As heat is applied, the polymer sheet returns to its original flat configuration prior to solder melting.

U.S. Pat. No. 3,719,981 discloses an alternative method of applying solder balls, which are appropriately spaced on the tacky surface of a pressure-sensitive tape, to solder bumps used for connections.

Both of the above methods rely on the positioning of the small pieces of solder immediately adjacent to the terminals which are to be soldered, and, because small pieces of solder are used, each of the solder systems disclosed is difficult to manufacture.

U.S. Pat. No. 3,750,252 discloses the use of a single continuous piece of solder to simultaneously solder a large number of terminals. The solder wire extends along a terminal strip and, on heating, the solder melts and coalesces on the individual contacts to form independent connections.

U.S. Patent application Ser. No. 133,038, filed Mar. 24, 1980 and assigned to the assignee of the present invention, also describes the use of a continuous solder strip. In this application, the disclosure of which is incorporated herein by reference, the solder strip is embedded within a heat-recoverable polymeric strip which, together with interfacial forces (capillary action), acts to direct the solder towards individual contacts when it melts.

The use of continuous solder strip offers significant advantages in decreased cost of manufacture over systems employing a plurality of solder pieces. However, as connector pin spacing decreases, capillary action, even with the assistance of a heat-recoverable substrate, may be less safely relied upon. This is particularly so with flat cable (multiple conductor planar cable), ribbon cable, or transmission line cable (TLC cable), which may have a conductor pitch as small as 0.025 inches. It is, therefore, extremely desirable to provide a solder delivery system suitable for multiple terminations which will minimize the possibility of solder bridges between adjacent terminals, while still ensuring an adequate flow of solder onto the terminals and conductors.

SUMMARY OF THE INVENTION

The present invention provides a solder delivery system which comprises a continuous strip of solder "sandwiched" between two layers of polymeric material, one of which layers has window means to direct the flow of flux and solder when heat is applied to melt the solder.

BRIEF DESCRIPTION OF THE DRAWING

FIG. 1 is an exploded view of a first embodiment of the solder delivery system of this invention, while FIG. 2 depicts this embodiment in cross-section.

FIGS. 3 through 5 depict the use of this first embodiment for termination of a plurality of conductors.

FIG. 6 depicts the use of a second embodiment of this invention. FIG. 7 shows three alternate shapes for the window means of the lower layer of polyermic material.

FIG. 8 depicts a third embodiment employing an adhesive.

FIG. 9 depicts a fourth embodiment, and FIGS. 10 through 12 the use of that embodiment.

FIG. 13 shows a fifth embodiment containing a sealant, and FIGS. 14 and 15 show its use.

FIG. 16 shows a sixth embodiment wherein one or more of the polymeric layers have been extended and heat-recoverable features created, while FIG. 17 shows a use for such heat-recoverable features.

FIG. 18 depicts a seventh embodiment wherein the upper polymeric strip has been extended.

FIG. 19 depicts an eighth embodiment employing sections of heat-shrinkable tubing, while FIG. 20 shows the use of this eighth embodiment.

FIG. 21 depicts a ninth embodiment in which the two layers of polymeric material are part of a folded polymeric sheet.

FIG. 22 depicts a tenth embodiment in which the two layers of polymeric material are part of a polymeric tube, while FIG. 23 shows a method of manufacture of the window means.

DESCRIPTION OF THE PREFERRED EMBODIMENTS

As used herein, solder means any metal or metallic alloy used to join metallic surfaces by melting that metal or metallic alloy and then allowing it to cool. A solder strip, as used herein, means an elongated, continuous element of solder of any cross-section including, but not limited to, round, square, flat, or any other cross-section. Such a solder strip may contain a flux core and/or may be coated on all or a part of its outer surface with a flux coating. The strip may be perforated to enable better flow of a flux core.

As used herein, the term "window means" is intended to comprise apertures in one or more of the polymeric layers of the system, which apertures are defined by the remaining wall portions of said polymeric layers when perforations have been made therein.

FIG. 1 depicts, in exploded view, a first embodiment of the solder delivery system of this invention. The system comprises an upper polymeric layer 30, a solder strip 32, which may have perforations 34 to enable better flux flow, and a lower polymeric layer 36, having window means 38, said solder strip 32 being positioned over said window means 38 through which the solder will flow on melting. Window means 38 also comprises a plurality of window frames 40. In this first embodiment, the upper and lower polymeric layers are attached together in laminate form by heat-welding at a plurality of points 42. Of course, this heat-welding may be performed along the entire edges of the polymeric layers, and not just at a series of points, if so desired. A fluxing agent 44 may be coated onto the underside of the upper polymeric layer 30 by any suitable means, either before assembly of the solder delivery system or after it has been assembled.

FIG. 2 is a cross-sectional view of the first embodiment of the solder delivery system, in its assembled form. The solder strip is seen to be sandwiched between the upper and lower polymeric layers.

The polymeric layers should preferably be made of materials capable of resisting temperatures as high as 400° C. for the time needed to melt and flow the solder, generally about 15 seconds. Suitable materials include, for example and not by way of limitation, polyvinylidene fluoride, poly(parabanic acid), and poly(pyromelittimide) or other high-temperature polyamides or -imides. These polymers may be cross-linked by either chemicals or radiation to improve their high-temperature properties.

In embodiments in which the polymeric layers are not of unitary construction, a typical thickness for the upper polymeric layer would be about 0.004 inches, while a typical thickness for the lower polymeric layer might be somewhat greater, for example, about 0.007 inches. Of course, when the polymeric layers comprise a single folded sheet or a tube, the thickness of the upper and lower layers will be the same, and will typically be from about 0.004 to about 0.007 inches. Depending on the application, the solder strip may be about 0.006 inches thick.

The width of the polymeric layers will, of course, depend on the application to some extent, but may be, for example, about 0.2 inches with the width of the window means being approximately the length of the connector tab.

FIGS. 3 through 5 depict the use of the solder delivery system to terminate a plurality of conductors to, for example, a connector body. In FIG. 3, the system is seen in cross-section emplaced above a plurality of conductors 48, each of which lies over a connector tab 52 emerging from a connector body 50. While the conductors 48 have been shown aligned on the center of the tabs 52, it is an advantage of this system that considerable misalignment of the conductors with their corresponding tabs will not adversely affect the quality of the soldered joints produced.

FIG. 4 depicts the assembly of FIG. 3 in cross-section parallel to the conductors. Wire 46 has conductor 48 which lies above the connector tab 52. A heating tool platen 54 is shown positioned above the assembly. This platen may be heated, for example, electrically or by focused, high-intensity infrared radiation applied to its upper surface. On the application of heat and pressure the upper polymeric layer 30 rapidly softens to allow close contact between the platen 54 and the solder 32 and conductor 48. Heat rapidly transfers to the connector tab 52, as all the items have low thermal mass. The flux present, either in flux coating 44 or associated with the solder strip 32, is directed onto the conductor and connector tab and cleans them so that the solder will form a sound joint. During the time the solder is molten, the polymeric window frames 40 will resist wetting by the molten solder and may swell due to the heating, thus effectively preventing the formation of solder bridges. The heating tool platen 54 remains in contact with the assembly throughout the heating-cooling cycle. This maintains conductor-tab contact until the solder joints are formed. The precise shape of the platen may be chosen to optimize heat flow to the metal parts, while minimizing heat damage to the plastic connector body or cable insulation. While the platen will generally be of unitary construction and rigid, it is also envisaged that the platen may comprise an elastomeric portion or may be of spring-loaded "piano-key" construction (with the "keys" being made, for example, from 0.025 or 0.050 inch wide leaf springs (reeds)). Such a conformable platen would accommodate connector tabs and/or conductors of different heights and thicknesses and ensure the application of adequate pressure and heat to the joints.

FIG. 5 shows the completed termination, where flowed solder 56 joins the conductors 48 to the connector tabs 52. The window frames 40 help prevent the formation of solder bridges between adjacent conductors or tabs.

FIG. 6 depicts a completed termination when a second embodiment of the system has been used. In this second embodiment, the lower polymeric layer has been rendered heat-recoverable in such a way that, on heating, the window frames 40 rotate, as shown by the arrows, from their original positions (shown in phantom) so as to more effectively block the flow of solder between adjacent conductors.

FIG. 7 shows some possible alternative shapes of the window means for different connector designs. In A, inset corners are used to align the solder strip in the center of the window; in B, at the bottom edge. The window means may also be shaped to aid in directing the solder flow. In C, portions of the lower polymeric layer have been cut away to accommodate connector features.

FIG. 8 depicts a third embodiment of the solder delivery system. In this embodiment, the upper and lower polymeric layers are not heat-welded together, but rather are joined by an adhesive 58. This adhesive also serves to locate the solder strip 32. The adhesive may be a pressure-sensitive adhesive, for example, one coated on the upper polymeric layer 30 before assembly, or may be a curable adhesive such as one cured by ultraviolet light or radiation. An advantage of curable adhesive is that it may be rendered non-flowing at soldering temperatures. If a radiation-curable adhesive is employed, cross-linking of the polymeric layers (if desired) and curing of the adhesive may be performed simultaneously.

In FIG. 9, the lower polymeric layer 36 of a fourth embodiment is shown. In this embodiment, windows have not been cut out from the layer but window means comprising louvers 60 have been formed in it. As with the layer of the second embodiment, this layer 36 has been rendered heat-recoverable.

FIG. 10 depicts this fourth embodiment of the system in use. The louvers 60 completely separate the conductor-tab pairs from each other.

A cross-sectional view in the direction indicated by the arrows A of FIG. 10 is shown in FIG. 11, illustrating the manner in which the louvers 60 act.

FIG. 12 depicts the assembly of FIG. 10 after heating. The flowed solder 56 has joined the conductors 48 to tabs 52, while the louvers 60 have recovered to pull the upper layer 30 towards the joint. Such an arrangement is especially suitable when it is intended that the polymeric layers remain in place on the joints instead of being removed.

FIG. 13 shows in cross-section a fifth embodiment of the solder delivery system which additionally comprises a sealant 62. Such a sealant may be, for example, a thermoplastic, hot-melt, mastic, or other suitable material.

In FIG. 14, the system of FIG. 13 is shown emplaced above a set of conductors 48 and a connector having tabs 52.

In FIG. 15, the assembly of FIG. 14 is shown after heating. The flowed solder 56 forms joints between the conductors 48 and tabs 52 while the flowed sealant 64 encapsulates these joints. The use of a sealant stabilizes the joints, lengthens the electrical leakage paths, and helps to immobilize conductive or ionic materials. This use is particularly appropriate when it is intended that the upper polymeric layer 30 should remain in place above the conductors 48.

In FIG. 16, a sixth embodiment of the solder delivery system of this invention is shown. One or both of the polymeric layers have been extended to form an extension 66, into which may be introduced additional features such as alignment holes. FIG. 16 depicts the formation of heat-recoverable features 68 shown, for example, as a fastening socket in this extension 66.

FIG. 17 shows a mode of use of the heat-recoverable features 68 shown in FIG. 16. When the features 68 are placed over a boss 70, for example, a locating boss on the body of the connector on which the system is to be employed, and heated, such as when the solder joints are made, the features recover to lock the polymeric layers onto the boss. Especially if the boss is mushroom-shaped, the system will be fastened to the boss in such a way that removal will require substantial force.

In FIG. 18, a seventh embodiment is shown, wherein the upper polymeric layer 30 has been extended to form an extension 72 which is coated with adhesive 58. Use of this embodiment enables the strip to be fastened to, for example, the cable as shown in phantom, which is to be terminated to a connector. Although only one side of the layer 30 has been shown extended, it is of course possible for both sides to be extended to adhere to both the cable and a connector. In this way, the soldered joints may be completely encapsulated.

FIG. 19 depicts an eighth embodiment of the solder delivery system in which a plurality of heat-shrinkable tubes 74 have been attached by adhesive to the extension 72 of the upper polymeric layer 30. This embodiment is particularly suitable for termination of individual conductors and/or terminations to protruding tabs.

FIG. 20 shows the mode of use of this embodiment. Tabs 76 protrude from connector body 50. Each of a plurality of wires 46 is placed through a heat-shrinkable tube 74 so that the conductor 48 lies over a tab 76. Then, with the body of the solder delivery system in position A, the assembly is heated in only the region of the tabs so as to solder the conductors to the tabs. When the soldering operation is complete, the upper polymeric layer is pulled up to position B (shown in phantom) and the tubes 74 slid forward in the direction of arrow C by pulling on the layer 30. When the tubes 74 each completely cover the soldered tab-conductor pairs, the polymeric layer 30 may be peeled completely free and the tubes 74 shrunk, by e.g., a hot-air gun or infrared lamp, to completely insulate the joints.

In FIG. 21, a ninth embodiment is shown, in which the upper and lower polymeric layers are part of a single polymeric sheet 78 which is folded about the solder strip 32 after the window means 38 have been formed in the sheet 78. The upper and lower layers 30 and 36 may be joined on the side opposite the fold by any suitable method, such as heat-welding or the use of an adhesive. While FIG. 21 depicts only the simplest form of this embodiment and corresponds generally to FIGS. 2 and 8 in that regard, it is of course possible for other features such as, for example, the heat-recoverable window frames of FIGS. 6 or 9, the sealant of FIG. 13, or the extensions of FIGS. 16–20 to be incorporated together with the folded sheet feature of this embodiment.

FIG. 22 illustrates a tenth embodiment in which the upper and lower polymeric layers are part of a polymeric tube 80. Window means 38 have been formed in this tube 80 and the tube flattened in such a way that the solder strip 32, which has been inserted in the tube, lies above the window means 38. A sealant or adhesive may also be placed within the tube, though this is not depicted in the Figure.

FIG. 23 illustrates a method of forming the window means in the tube 80 of FIG. 22. The tube is flattened by a set of vertical rolls 82 and a punch or cutter 84 used to cut one edge of the flattened tube. If the tube is then re-flattened by a set of horizontal rolls 86 at 90° to the first set, window means 38 are formed in the tube. Depending on the polymer properties, a simple re-flattening of the tube may be sufficient to form the window means, or it may be desirable to hold the tube flat by the use of an internal adhesive or by heat-welding portions of the tube together.

From the foregoing detailed description of several embodiments of this invention, it is evident that there may be a number of changes, adaptations, and modifications which come within the province of those skilled in the art. However, it is intended that all such variations not departing from the spirit of the invention should be considered within the scope thereof as limited solely by the appended claims.

We claim:
1. A solder delivery system comprising:
(a) two layers of polymeric material, at least one of said layers having a plurality of perforations defined therein and extending through said at least one layer; said plurality of perforations being arranged such that wall portions of the perforations define means providing apertures in said at least one layer; and
(b) a solder strip disposed between and in operative contact with said layers; said solder strip extending continuously along said layers and traversing at least two of said means, said wall portions and apertures being arranged to divide said solder strip into at least two discontinuous portions and direct the flow of said discontinuous solder portions through said apertures when said solder is heated.
2. A solder delivery system as in claim 1 wherein said aperatures are generally rectangular.

3. A solder delivery system as in claim 1 wherein said perforations are such that the wall portions form louvers.

4. A solder delivery system as in claim 1 wherein the polymeric material comprising the layer having perforations is heat-recoverable.

5. A solder delivery system as in claim 1 wherein said layers of polymeric material comprise separate pieces of material joined along the edges thereof.

6. A solder delivery system as in claim 1 wherein said layers of polymeric material comprise a folded sheet.

7. A solder delivery system as in claim 1 wherein said layers of polymeric material comprise a tube defining said two layers.

8. A solder delivery system as in claim 1 additionally comprising an adhesive disposed between said layers and on a side of said solder strip which is remote from said layer having perforations.

9. A solder delivery system as in claim 1 additionally comprising a sealant disposed between said layers and on a side of said solder strip which is away from said layer having perforations.

10. A solder delivery system as in claim 1 additionally comprising a flux disposed between said layers.

11. A solder delivery system as in claim 1 wherein at least one of said layers has a portion extended in a direction transverse to the longitudinal direction of said solder strip.

12. A solder delivery system as in claim 11 wherein said extended portion additionally comprises heat-recoverable features.

13. A solder delivery system as in claim 11 wherein said extended portion additionally comprises a layer of adhesive on that side of said extended portion such that said system may be adhered by said adhesive to a substrate intended to be soldered by said system.

14. A solder delivery system as in claim 11 wherein said extended portion additionally comprises a plurality of sections of heat-recoverable tubing attached (a) on that side of said extended portion such that said tubing sections are enabled to contain substrates intended to be soldered by said system, (b) directed away from said solder strip, and (c) aligned with said apertures.

* * * * *